US006830302B2

(12) United States Patent
Masumoto et al.

(10) Patent No.: US 6,830,302 B2
(45) Date of Patent: Dec. 14, 2004

(54) WAVEFORM GENERATING CIRCUIT, INKJET HEAD DRIVING CIRCUIT AND INKJET RECORDING DEVICE

(75) Inventors: Kenichi Masumoto, Osaka (JP); Hiroaki Miyaso, Hyogo (JP); Masaharu Oyama, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 21 days.

(21) Appl. No.: 10/297,425

(22) PCT Filed: Oct. 24, 2001

(86) PCT No.: PCT/JP01/09352

§ 371 (c)(1),
(2), (4) Date: Dec. 5, 2002

(87) PCT Pub. No.: WO02/34528

PCT Pub. Date: May 2, 2002

(65) Prior Publication Data

US 2004/0032436 A1 Feb. 19, 2004

(30) Foreign Application Priority Data

Oct. 24, 2000 (JP) ....................................... 2000-324011

(51) Int. Cl.[7] ......................... B41J 29/38; H02K 33/00; H02K 35/00; H02K 7/00; H03M 1/76

(52) U.S. Cl. ............................. 347/9; 347/10; 310/317; 341/148

(58) Field of Search ................................ 347/9, 10, 68; 310/316.01, 317; 318/116–118; 341/144, 148, 152

(56) References Cited

U.S. PATENT DOCUMENTS 5,631,675 A * 5/1997 Futagawa .................... 347/10

FOREIGN PATENT DOCUMENTS

JP 10-250061 9/1998

OTHER PUBLICATIONS

International Search Report, PCT/JP01/09352; ISA/JPO, Jan. 7, 2002.

* cited by examiner

*Primary Examiner*—Michael S. Brooke
(74) *Attorney, Agent, or Firm*—Harness, Dickey & Pierce, P.L.C.

(57) ABSTRACT

An inkjet head driving circuit driving piezoelectric actuators 21 for ink ejection provided on an inkjet head H includes one D/A converter 62 that converts a digital signal into an analog voltage and outputs the analog voltage, and a waveform generating portion 64 into which an output voltage of the D/A converter 62 is input, and which generates a voltage rising waveform when the output voltage of the D/A converter 62 is larger than a predetermined potential that is midway between a maximum value and a minimum value of that output voltage, and generates a voltage rising waveform when the output voltage of the D/A converter 62 is smaller than the predetermined potential.

7 Claims, 6 Drawing Sheets

WAVEFORM GENERATING CIRCUIT, INKJET HEAD DRIVING CIRCUIT AND INKJET RECORDING DEVICE

TECHNICAL FIELD

The present invention belongs to the technical fields relating to waveform generating circuits generating voltage waveforms, inkjet head driving circuits driving actuators for ink ejection provided on an inkjet head, and inkjet recording devices provided with an inkjet head having actuators that are driven by such an inkjet head driving circuit.

BACKGROUND ART

Conventionally, inkjet heads having actuators for ink ejection are well known, and examples of such actuators of inkjet heads are piezoelectric actuators provided with electrodes on both sides of a piezoelectric element, which constitute a portion of a pressure chamber accommodating the ink. When a pulse-shaped voltage is applied to the electrodes of such an actuator, the actuator is deformed such that the volume of the pressure chamber is reduced, thus creating a pressure in the pressure chamber, which ejects ink drops from a nozzle that is in communication with the pressure chamber.

As shown for example in FIG. 8, the voltage waveform applied to the actuators is made of a first waveform P1' (voltage-falling waveform), at which the potential falls from ground potential to the minimum potential (−Vf), a second waveform P2' continuing the first waveform P1' and maintaining this minimum potential, a third waveform P3' (voltage-rising waveform) continuing the second waveform P2' and rising from the minimum potential to the maximum potential (Vf), a fourth waveform P4' continuing the third waveform P3' and maintaining this maximum potential, and a fifth waveform P5' (voltage falling waveform) continuing the fourth waveform P4' and returning from the maximum potential to ground potential. This series of first to fifth waveforms P1' to P5' constitutes one driving pulse P' for ejecting one ink drop from the nozzle, and the driving pulse P' is given out repeatedly with a predetermined period.

An example of a waveform generating circuit (inkjet head driving circuit) generating the voltage waveform (driving pulse P') for driving the actuator is shown in FIG. 9. In this drawing, numeral 101 is a CPU, which has two terminals outputting digital signals (for example of 8 bits) for generating the voltage waveform. A first D/A converter 102 for converting a digital signal into a positive analog signal and giving it out and a second D/A converter 103 for converting a digital signal into a negative analog signal and giving it out are connected to the digital signal output terminals of this CPU 101. The first and second D/A converters 102 and 103 receive from the CPU 101 a data set signal together with the digital signals but from a different terminal than the digital signals, and when this data set signal has been input and a predetermined time (data settling time) has elapsed after its input (after the output of the D/A converter 102 (or 103) has settled), the analog voltage is given out. The first D/A converter 102 is connected to a first power source 106 giving out a positive voltage, whereas the second D/A converter 103 is connected to a second power source 107 giving out a negative voltage.

A first and a second voltage/current converter 109 and 110 are respectively connected to the output terminals of the first and the second D/A converter 102 and 103, and these first and second voltage/current converters 109 and 110 convert the positive and the negative analog voltage into currents. The output terminals of the first and second voltage/current converters 109 and 110 are connected to a current/voltage converter amplifier 111, which amplifies the currents into which the voltages have been converted by the first and second voltage/current converters 109 and 110, and converts the amplified currents into a voltage. It should be noted that the first voltage/current converter 109, which is connected to the output terminal of the first D/A converter 102, is connected to the first power source 106, whereas the second voltage/current converter 110, which is connected to the output terminal of the second D/A converter 103, is connected to the second power source 107, and the current/voltage converter amplifier 111 is connected to both the first power source 106 and the second power source 107.

Based on the output voltage from the first and second D/A converters 102 and 103, the first and second voltage/current converters 109 and 110 and the current/voltage converter amplifier 111 generate voltage waveforms like the first to fifth waveforms P1' to P5'. More specifically, when the first D/A converter 102 outputs a positive analog voltage and the second D/A converter 103 outputs ground potential, the voltage rising waveform (third waveform P3') is generated, whereas when the second D/A converter 103 outputs a negative analog voltage and the first D/A converter 102 outputs ground potential, the voltage falling waveforms (first and fifth waveforms P1' and P5') are generated. Furthermore, when both D/A converters 102 and 103 output ground potential, waveforms maintaining the potential directly before the output of those ground potentials (second and fourth waveforms P2' and P4') are generated, and the potential between neighboring driving pulses P' is maintained at ground potential.

Then, the generated voltage waveform is applied to a multitude of actuators of the inkjet head, through a current amplifier 113, which is made of two transistors 113*a*, and a driver IC 114. The driver IC 114 includes for example switching transistors that are provided in accordance with the actuators, and, receiving print signals from the CPU 101, selects the actuators corresponding to the nozzles through which ink drops are to be ejected, thus applying the voltage waveform only to the selected actuators.

However, this conventional waveform generating circuit necessitates two D/A converters 102 and 103 to generate the voltage rising waveform and the voltage falling waveform, and a positive voltage has to be supplied to the first D/A converter 102 and a negative voltage has to be supplied to the second D/A converter 103, thus necessitating two power sources 106 and 107 for respectively outputting a positive and a negative voltage, so that there is the problem that it is expensive and requires relatively much space. Furthermore, discrepancies in the characteristics among the first and second D/A converters 102 and 103 (discrepancies among variation amounts) cause discrepancies among the generated waveforms.

In view of these facts, it is thus an object of the present invention to improve the configuration of the above-described waveform generating circuit, and thus attain a simple configuration that is less expensive and takes up less space, and with which stable voltage waveforms can be attained.

DISCLOSURE OF THE INVENTION

In order to attain these objects, in the present invention, one D/A converter is provided, and when the output voltage of the D/A converter is larger than a predetermined voltage that is midway between a maximum value and a minimum value of that output voltage, one of a voltage rising waveform and a voltage falling waveform is generated, and when the output voltage of the D/A converter is smaller than the predetermined potential, the other waveform is generated.

More specifically, according to a first invention, a waveform generating circuit includes one D/A converter that converts a digital signal into an analog voltage and outputs the analog voltage, and a waveform generating portion into which an output voltage of the D/A converter is input, which generates one of a voltage rising waveform and a voltage falling waveform when the output voltage of the D/A converter is larger than a predetermined potential that is midway between a maximum value and a minimum value of that output voltage, and generates the other waveform when the output voltage of the D/A converter is smaller than the predetermined potential.

With this configuration, a voltage rising waveform and a voltage falling waveform are generated taking a predetermined potential that is midway between a maximum value and a minimum value of the output voltage of one D/A converter as a reference, so that it is not necessary to provide two D/A converters as in conventional circuits, and moreover, one power source outputting either a positive or a negative voltage is sufficient. Furthermore, waveform generation discrepancies due to discrepancies in the characteristics among the two D/A converters, as in conventional circuits, do not occur. As a result, it is possible to achieve a circuit that is less expensive and uses less space, and stable voltage waveforms can be generated.

According to a second invention, the first invention further includes a constant voltage source outputting a constant voltage equal to the predetermined potential, and a switching means, whose input can be switched between the output voltage of the D/A converter and the output voltage of the constant voltage source, and which outputs one of those two output voltages to the waveform generating portion, wherein the switching means is configured such that when a digital signal for generating a voltage rising waveform or a voltage falling waveform with the waveform generating portion is input into the D/A converter, the input into the switching means is switched from the output voltage of the constant voltage source to the output voltage of the D/A converter.

With this configuration, the input into the switching means is set to the output voltage of the constant voltage source when neither the voltage rising waveform nor the voltage falling waveform are generated, and is switched from the output voltage of the constant voltage source to the output voltage of the D/A converter when the voltage rising waveform or the voltage falling waveform is generated. As a result, when neither the voltage rising waveform nor the voltage falling waveform are generated, a predetermined potential is output to the waveform generating portion from the constant voltage source, which can output a precise voltage, even if the D/A converter outputs a voltage that is slightly different from the predetermined potential due to variations of its characteristics, so that malfunctioning of the waveform generating portion due to such variations in the characteristics of the D/A converter can be prevented.

According to a third invention, in the second invention, the switching means is configured such that the input into the switching means is switched from the output voltage of the constant voltage source to the output voltage of the D/A converter after the output of the D/A converter has settled.

That is to say, the time from the input of the data set signal until the output of the D/A converter has settled fluctuates depending on the output voltage of the D/A converter and variations in its characteristics, so that if there is no switching means, or even if there is the switching means, but the input into the switching means is switched to the output voltage of the D/A converter before the output of the D/A converter has settled, then the result is variations in the generation timing (output timing) of the voltage rising waveform or the voltage falling waveform by the waveform generating portion. However, in this invention, the input into the switching means is switched to the output voltage of the D/A converter only after the output of the D/A converter has settled, so that the voltage rising waveform or voltage falling waveform can be generated and output substantially at the same time as the switching of the input into the switching means. As a result, variations in the waveform generating timing brought about by fluctuations in the output settling time of the D/A converter can be prevented.

A fourth invention is an invention of an inkjet head driving circuit driving an actuator for ink ejection provided on an inkjet head, and this invention includes one D/A converter that converts a digital signal into an analog voltage and outputs the analog voltage, and a waveform generating portion into which an output voltage of the D/A converter is input, which generates one of a voltage rising waveform and a voltage falling waveform and outputs it to the actuator when the output voltage of the D/A converter is larger than a predetermined potential that is midway between a maximum value and a minimum value of that output voltage, and which generates the other waveform and outputs it to the actuator when the output voltage of the D/A converter is smaller than the predetermined potential.

With this invention, a similar operational effect as in the first invention can be attained.

According to a fifth invention, the fourth invention further includes a constant voltage source outputting a constant voltage equal to the predetermined potential, and a switching means, whose input can be switched between the output voltage of the D/A converter and the output voltage of the constant voltage source, and which outputs one of those two output voltages to the waveform generating portion, wherein the switching means is configured such that when a digital signal for generating a voltage rising waveform or a voltage falling waveform with the waveform generating portion is input into the D/A converter, the input into the switching means is switched from the output voltage of the constant voltage source to the output voltage of the D/A converter.

Thus, a similar operational effect as in the second invention can be attained.

According to a sixth invention, in the fifth invention, the switching means is configured such that the input into the switching means is switched from the output voltage of the constant voltage source to the output voltage of the D/A converter after the output of the D/A converter has settled.

Thus, a similar operational effect as in the third invention can be attained.

A seventh invention is an invention of an inkjet recording device, and this invention includes:

- an inkjet head having a pressure chamber filled with ink, a nozzle linked to the pressure chamber, and an actuator that is caused to eject the ink inside the pressure chamber through the nozzle by application of a voltage;
- a relative movement means that moves the inkjet head and a recording medium relatively to one another; and
- an inkjet head driving circuit driving the actuator of the inkjet head;

wherein the inkjet head driving circuit comprises one D/A converter that converts a digital signal into an analog voltage and outputs the analog voltage, and a waveform generating portion into which an output voltage of the D/A converter is input, which generates one of a voltage rising waveform and a voltage falling waveform and outputs it to the actuator when the output voltage of the D/A converter is larger than a predetermined potential that is midway between a maximum value and a minimum value of that output voltage, and which generates the other waveform and outputs it to the actuator when the output voltage of the D/A converter is smaller than the predetermined potential; and wherein recording is performed by ejecting ink from the nozzle of the inkjet head onto the recording medium by outputting to the actuator the voltage waveform generated by the waveform generating portion of the inkjet head driving circuit when the inkjet head is moved in relation to the recording medium by the relative movement means.

With this invention, an inkjet recording device easily can be attained, which is compact, inexpensive and has superior ink ejection performance.

BEST MODE FOR CARRYING OUT THE INVENTION

Figure 1:
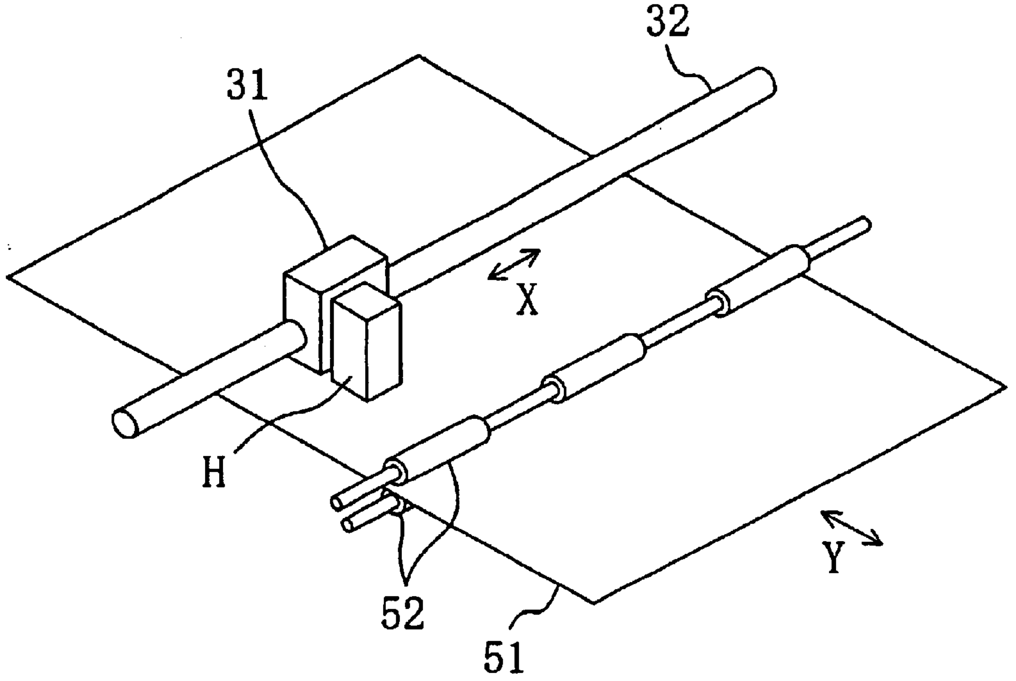
FIG. 1 is a schematic perspective view showing an inkjet recording device in accordance with an embodiment of the present invention.

FIG. 1 schematically shows an inkjet recording device in accordance with an embodiment of the present invention. This inkjet recording device is provided with an inkjet head H that ejects ink onto recording paper 51 serving as a recording medium, as will be described later. The inkjet head H is fixed to and supported by a carriage 31, which is provided with a carriage motor not shown in the drawings, by which the inkjet head H and the carriage 31 are guided on a carriage shaft 32 extending in the primary scan direction (X direction in FIG. 1), moving back and forth in this direction. The carriage 31, the carriage shaft 32 and the carriage motor constitute a relative movement means for moving the inkjet head H relatively to the recording paper 51.

The recording paper 51 is clamped by two feed rollers 52 that are rotatively driven by a feed motor not shown in the drawings. The feed motor and the feed rollers 52 feed the recording paper 51 in a secondary scan direction (Y direction in FIG. 1), which is perpendicular to the primary scan direction, below the inkjet head H.

Figure 2:
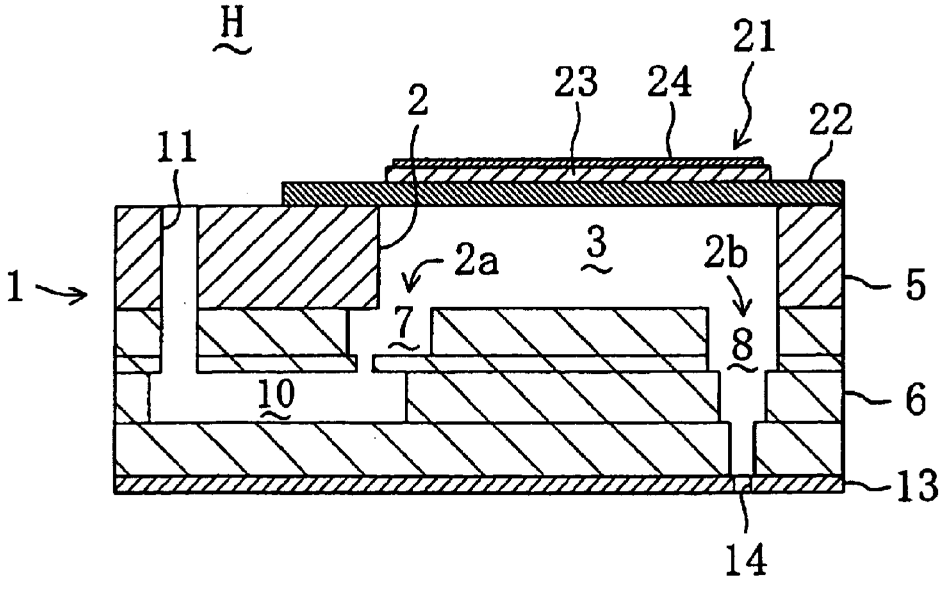
FIG. 2 is a cross-sectional drawing taken along the main scan direction of the inkjet head of the inkjet recording device of FIG. 1.

As shown in FIG. 2, the inkjet head H includes a head body 1, in which a plurality of pressure chamber cavities 2 are formed, which have a supply port 2*a* for supplying ink and an ejection port 2*b* for ejecting ink. The cavities 2 of the head body 1, which are formed in the upper side of the head body 1, are extended in the primary scan direction, and are lined up in the secondary direction, leaving a substantially equal spacing between them.

The lateral wall portions of the cavities 2 of the head body 1 are constituted by a pressure chamber component 5 made of photosensitive glass of about 200 μm thickness, and the bottom wall portion of the cavities 2 is made of an ink channel component 6 that is affixed to the pressure chamber component 5 and made by laminating a plurality of stainless steel sheets. Inside this ink channel component 6, supply ink channels 7 connected to the supply ports 2*a* of the cavities 2 and ejection ink channels 8 connected to the ejection ports 2*b* of the cavities 2 are formed. Each supply ink channel 7 is connected to an ink supply chamber 10 extending in the same direction in which the cavities 2 are lined up (secondary scan direction). This ink supply chamber 10 is formed by the pressure chamber component 5 and the ink channel component 6, and is connected to an ink supply hole 11 connected to an ink tank outside the drawing.

On the side of the ink channel component 6 that is opposite to the pressure chamber component 5 (i.e. the lower side), a nozzle plate 13 of about 20 μm thickness is provided, which constitutes the lower side of the inkjet head H and is made of a polymer resin, such as polyimide. Nozzles 14 of about 20 μm diameter are formed in the nozzle plate 13, and are respectively connected to the ejection ports 2*b* through the ejection ink channel 8. The nozzles 14 are aligned in a row in the secondary scan direction.

In the pressure chamber component 5 of the head body 1, the side opposite the ink channel component 6 (i.e. the upper side) is provided with piezoelectric actuators 21 that cover the cavities 2 of the head body 1 and form the pressure chambers 3 together with the cavities 2. These piezoelectric actuators 21 include a piezoelectric layer 23 of 1 to 10 μm thickness made of lead zirconium titanate (PZT), an upper electrode layer 24 made of Pt of 0.05 to 0.6 μm thickness provided on the side of the piezoelectric layer 23 that is opposite the pressure chamber 3 (i.e. the upper side), and a lower electrode layer 22 made of Cr of 1 to 10 μm thickness provided on the pressure chamber 3 side of the piezoelectric layer 23 (i.e. the lower side). The lower electrode layer 22, which is shared by all piezoelectric actuators 21, is grounded and fulfills the function of a so-called oscillation plate.

Figure 3:
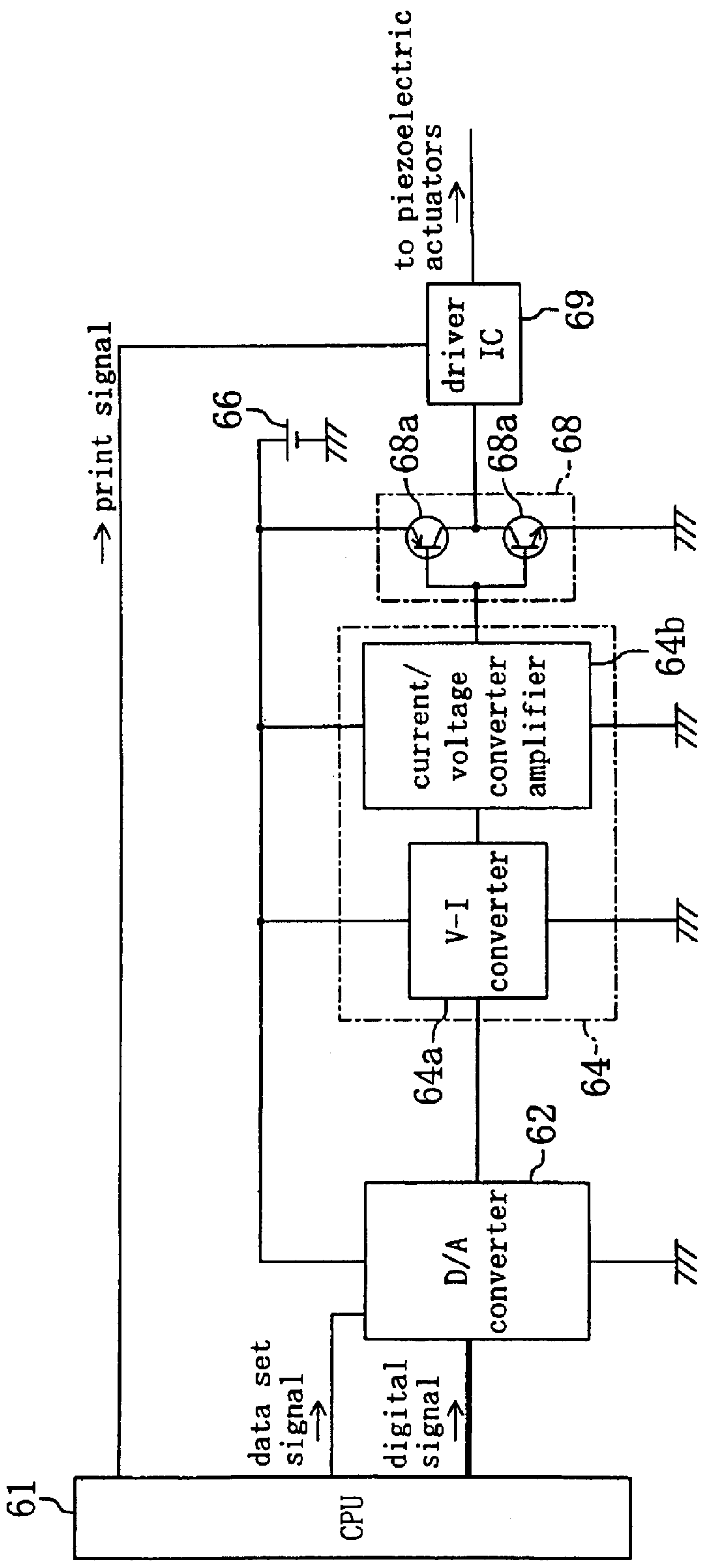
FIG. 3 is a schematic circuit diagram showing a first example of an inkjet head driving circuit driving piezoelectric actuators for inkjet ejection provided on an inkjet head.

FIG. 3 shows a first example of an inkjet head driving circuit (waveform generating circuit) driving the piezoelectric actuators 21 for ink ejection provided in the inkjet head H. The inkjet head driving circuit according to this first example includes a CPU 61 having a terminal outputting a digital signal (of for example 8 bits) for generating a voltage waveform, one D/A converter 62 connected to the digital signal output terminal of the CPU 61, which converts the digital signal into an analog signal and outputs it, and a waveform generating portion 64 into which the output voltage (analog voltage) of the D/A converter 62 is input, and which, based on this output voltage, generates a voltage waveform as explained below and outputs it to the piezoelectric actuator 21.

The D/A converter 62 receives from the CPU 61 a data set signal together with the digital signal but from a different terminal than the digital signal, and when this data set signal has been input and a predetermined time (data settling time: depends on the output voltage) has elapsed after its input (after the output of the D/A converter 62 has settled), the analog voltage is given out. The D/A converter 62 is connected to a power source 66 giving out a positive voltage V1, and is configured such that it can output any voltage from ground potential to the output voltage V1 of the power source 66, depending on the digital signal.

The output terminal of the D/A converter 62 is connected to the waveform generating portion 64. The waveform generating portion 64 includes a voltage/current converter 64*a*, which converts the analog voltage output from the D/A converter 62 into a current, and a current/voltage converter amplifier 64*b*, which amplifies, with a current mirror circuit made of two resistors and two transistors, the current into which the voltage has been converted by the voltage/current converter 64*a* (the amplification ratio depending on the resistance ratio between the two resistors), and which converts the amplified current into a voltage with a capacitor. The voltage/current converter 64*a* and the current/voltage converter amplifier 64*b* are connected to the same power source 66 as the D/A converter 62.

The waveform generating portion 64 is configured such that when the output voltage of the D/A converter 62 is larger than the predetermined potential V2, which is midway between the maximum value (V1) and the minimum value (ground potential) of this output voltage (in this embodiment, the median potential (V1/2) of the maximum value and the minimum value is taken, but any value is suitable that is midway between the maximum value and the minimum value), then the waveform generating portion 64 generates a voltage rising waveform, whereas when the output voltage of the D/A converter 62 is smaller than the predetermined potential V2, then the waveform generating portion 64 generates a voltage falling waveform. Moreover, when the output voltage of the D/A converter 62 is the predetermined potential V2, then it generates a waveform maintaining the potential directly before the output of that predetermined potential V2.

The output terminal of the waveform generating portion 64 is connected via a current amplifier 68, which is made of two transistors 68*a*, and a driver IC 69 to the upper electrode layer 24 of the piezoelectric actuators 21 of the inkjet head H. The driver IC 69 includes for example switching transistors provided in correspondence with the piezoelectric actuators 21, and, receiving print signals from the CPU 61, selects the piezoelectric actuators 21 corresponding to the nozzles 14 through which ink drops are to be ejected, thus applying the voltage waveform that is generated and output by the waveform generating portion 64 only to the selected actuators 21.

Figure 4:
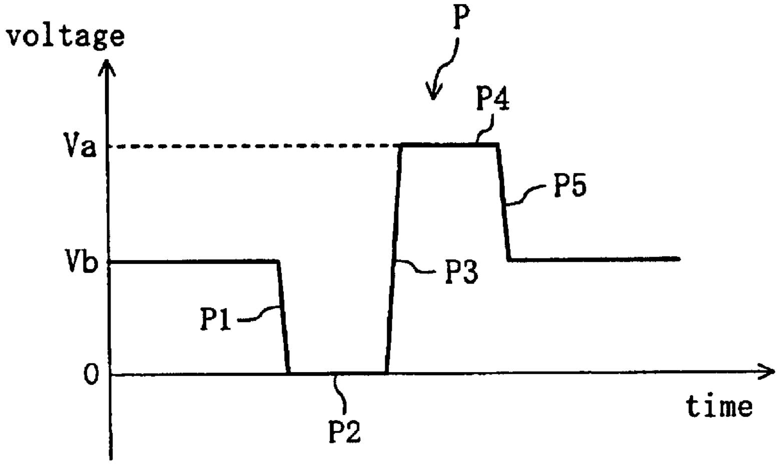
FIG. 4 is a waveform diagram showing an example of a voltage waveform applied to the piezoelectric actuators.

As shown for example in FIG. 4, the voltage waveform applied to the piezoelectric actuators 21 is made of a first waveform P1 (voltage falling waveform), at which the potential falls from an intermediate potential Vb, which is midway between the maximum potential (Va) and the minimum potential (ground potential), to the minimum potential, a second waveform P2 continuing the first waveform P1 and maintaining this minimum potential, a third waveform P3 (voltage rising waveform) continuing the second waveform P2 and rising from the minimum potential to the maximum potential, a fourth waveform P4 continuing the third waveform P3 and maintaining this maximum potential, and a fifth waveform PS (voltage falling waveform) continuing the fourth waveform P4 and returning from the maximum potential to the intermediate potential Vb. This series of first to fifth waveforms P1 to P5 constitutes one driving pulse P for ejecting one ink drop from the nozzle 14, and the driving pulse P is given out repeatedly with a predetermined period (for example about 50 μs, i.e. a driving frequency of 20 kHz). The potential between neighboring driving pulses P is maintained at the intermediate potential Vb. That is to say, the driving pulse P is of the pull-push-pull type with the intermediate potential Vb as the reference potential.

Figure 5:
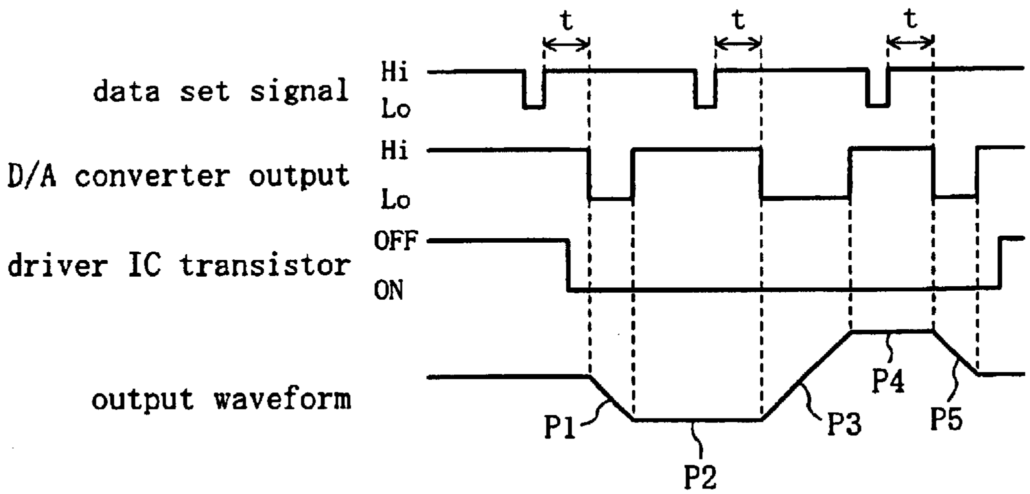
FIG. 5 is a time-chart for generating the voltage waveform in FIG. 4 with the inkjet head driving circuit according to the first example.

Next, the operation of this first example of an inkjet head driving circuit for generating these first to fifth waveforms P1 to P5 is explained with FIG. 5.

At the stage before generating the waveforms, a digital signal, which sets the output voltage of the D/A converter 62 to the predetermined potential V2, is given out from the CPU 61 to the D/A converter 62. Thus, the waveform generating portion 64 outputs the intermediate potential Vb.

Then, a data set signal and a digital signal that sets the output voltage of the D/A converter 62 to a lower value than the predetermined potential V2 (in this embodiment, to the minimum value of the output voltage (ground potential)) are output from the CPU 61 to the D/A converter 62 (in FIG. 5, the Lo state is assumed during the output of the data set signal), and after a predetermined time (the time t in FIG. 5) has elapsed after the input of the data set signal, the output of the D/A converter 62 is settled, and the analog signal into which the digital signal has been converted is output (in FIG. 5, the Lo state is assumed during the output of the analog signal (i.e. outside the predetermined potential V2), and the Hi state is assumed during the output of the predetermined potential V2). Due to the output of this analog voltage, the waveform generating portion 64 generates/outputs, with its current/voltage converter amplifier 64*b*, the first waveform P1, at which the potential falls from the intermediate potential Vb to the minimum potential. It should be noted that before the output of the D/A converter 62 has settled, the driver IC 69 receives print signals from the CPU 61 to select the piezoelectric actuators 21 corresponding to the nozzles 14 through which ink drops are to be ejected, and sets the switching transistors corresponding to the selected piezoelectric actuators 21 to the ON state, which is then maintained until after the generation of the fifth waveform P5 has been terminated.

Subsequently, after the generation of the first waveform P1 has been terminated, a digital signal that sets the output voltage of the D/A converter 62 to the predetermined potential V2 is output from the CPU 61 to the D/A converter 62, so that the waveform generating portion 64 generates/outputs the second waveform P2, at which the minimum potential is maintained.

Next, a data set signal and a digital signal that sets the output voltage of the D/A converter 62 to a larger value than the predetermined potential V2 (in this embodiment, to the maximum value V1 of the output voltage) are output from the CPU 61 to the D/A converter 62, and when the output of the D/A converter 62 has settled, the analog voltage is output. Due to the output of this analog voltage, the waveform generating portion 64 generates/outputs, with its current/voltage converter amplifier 64*b*, the third waveform P3, at which the potential rises from the minimum potential to the maximum potential.

Then, after the generation of the third waveform P3 has been terminated, a digital signal that sets the output voltage of the D/A converter 62 to the predetermined potential V2 is output from the CPU 61 to the D/A converter 62, so that the waveform generating portion 64 generates/outputs the fourth waveform P4, at which the maximum potential is maintained.

Next, a data set signal and a digital signal that sets the output voltage of the D/A converter 62 to the minimum value are output from the CPU 61 to the D/A converter 62, and when the output of the D/A converter 62 has settled, the analog voltage is output. Due to the output of this analog voltage, the waveform generating portion 64 generates/outputs, with its current/voltage converter amplifier 64*b*, the fifth waveform P5, at which the potential falls from the maximum potential to the intermediate potential.

Then, after the generation of the fifth waveform P5 has been terminated, a digital signal that sets the output voltage of the D/A converter 62 to the predetermined potential V2 is output from the CPU 61 to the D/A converter 62, so that the waveform generating portion 64 outputs the intermediate potential Vb, until the next driving pulse P is generated.

The operation of the inkjet head H is as follows: when the first waveform P1 generated/output by the waveform generating portion 64 is applied to the piezoelectric actuator 21, the piezoelectric layer 23 expands in the direction perpendicular to its thickness direction, due to the electric field created inside the piezoelectric layer 23, whereas the lower electrode layer 22 and the upper electrode layer 24 do not expand, so that due to the so-called bi-metal effect, a portion of the piezoelectric actuator 21 that corresponds to the pressure chamber 3 is deformed and bent such that it becomes convex on the side opposite the pressure chamber 3.

Then, when the third waveform P3 is applied to the piezoelectric actuator 21, the piezoelectric layer 23 contracts, and the portion of the piezoelectric actuator 21 that corresponds to the pressure chamber 3 is deformed and bent such that it becomes convex on the side of the pressure chamber 3. This bend deformation causes a pressure inside the pressure chamber 3, and due to this pressure, a predetermined amount of the ink in the pressure chamber 3 is ejected via the ejection port 2*b* and the ejection ink channel 8 and through the nozzle 14 onto the recording paper 51, adhering in dot shape to the recording paper 51.

Next, when the fifth waveform P5 is applied to the piezoelectric actuator 21, the piezoelectric layer 23 expands, and the portion of the piezoelectric actuator 21 that corresponds to the pressure chamber 3 is returned to its original state. During the application of the first and the fifth waveforms P1 and P5, ink is filled from the ink supply chamber 10 via the supply ink channel 7 and the supply port 2*a* into the pressure chamber 3.

The application of the voltage waveform to the piezoelectric actuator 21 is carried out repeatedly at an output period of the driving pulse P while the inkjet head H and the carriage 31 are moved at substantially constant speed in the primary scan direction from one end of the recording paper 51 to the other (however, when the inkjet head H has reached a location on the recording paper 51 onto which no ink drop is shot, the voltage waveform is not applied by the driver IC 69), and thus ink drops are shot onto predetermined positions of the recording paper 51. Then, when the recording for one scan line has been finished, the recording paper 51 is fed by the feed motor and the feed rollers 52 for a predetermined amount in the secondary scan direction, and ink drops are ejected again while the inkjet head H and the carriage 31 are moved in the primary scan direction, and the recording for the next scan line is carried out. By repeating this operation, the desired image is formed over the entire recording paper 51.

Consequently, with the inkjet head driving circuit according to this first example, a voltage rising and a voltage falling waveform are generated taking as a reference the predetermined potential V2, which is midway between the maximum value and the minimum value of the output voltage of one D/A converter 62, so that two D/A converters, as in the conventional circuit, are not necessary, and moreover, a power source outputting a negative voltage is not necessary and one power source 66 outputting a positive voltage is sufficient. Furthermore, waveform generation discrepancies due to discrepancies in the characteristics among the two D/A converters (discrepancies among variation amounts), as in the conventional circuit, do not occur. As a result, it is possible to achieve a circuit that is less expensive and uses less space, and stable voltage waveforms can be generated. Thus, an inkjet recording device that is compact and inexpensive and has superior ink ejection performance can be easily attained.

Figure 6:
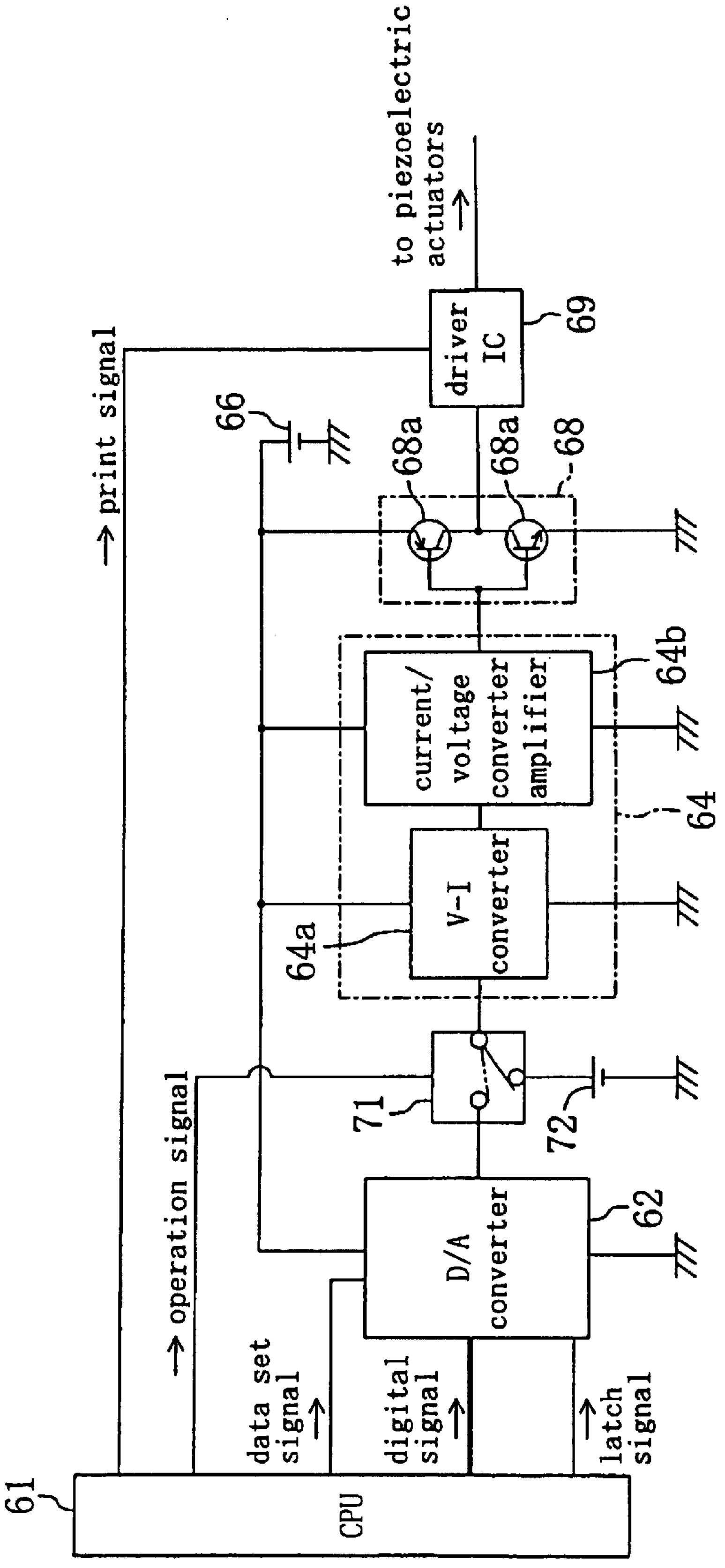
FIG. 6 is a schematic circuit diagram showing a second example of an inkjet head driving circuit.

FIG. 6 shows an inkjet head driving circuit in accordance with a second example (portions that are the same as in FIG. 3 have been denoted by identical numerals and their further explanation has been omitted), which has an analog switch 71 serving as a switching means provided between the D/A converter 62 and the waveform generating portion 64.

That is to say, in this second example, a constant voltage source 72 that outputs a constant voltage equal to the predetermined potential V2 is provided, and the analog switch 71 outputs either the output voltage of the D/A converter 62 or the output voltage of the constant voltage source 72 to the waveform generating portion 64, its switching state being determined by an operation signal from the CPU 61. More specifically, when neither a voltage rising waveform nor a voltage falling waveform is being generated by the waveform generating portion 64 (when no digital signal for generating a voltage rising waveform or a voltage falling waveform with the waveform generating portion 64 is being input to the D/A converter 62), then the input into the analog switch 71 is the output voltage of the constant voltage source 72 (the analog switch 71 is set to the state indicated by the solid line in FIG. 6), and when a digital signal for generating either a voltage rising waveform or a voltage falling waveform with the waveform generating portion 64 is input to the D/A converter 62 (when a digital signal setting the output voltage of the D/A converter 62 to the maximum value or the minimum value is input from the CPU 61 to the D/A converter 62), then the input into the analog switch 71 is switched from the output voltage of the constant voltage source 72 to the output voltage of the D/A converter 62 (the analog switch 71 is set to the state indicated by the double-dashed line in FIG. 6). This switching of the input is performed after the digital signal for generating a voltage rising waveform or a voltage falling waveform with the waveform generating portion 64 has been input and the output of the D/A converter 62 has settled.

It should be noted that a latch signal is input into the D/A converter 62 through a terminal different from that for the digital signal and the data set signal, and the output state of the analog voltage is maintained by the input of this latch signal.

Figure 7:
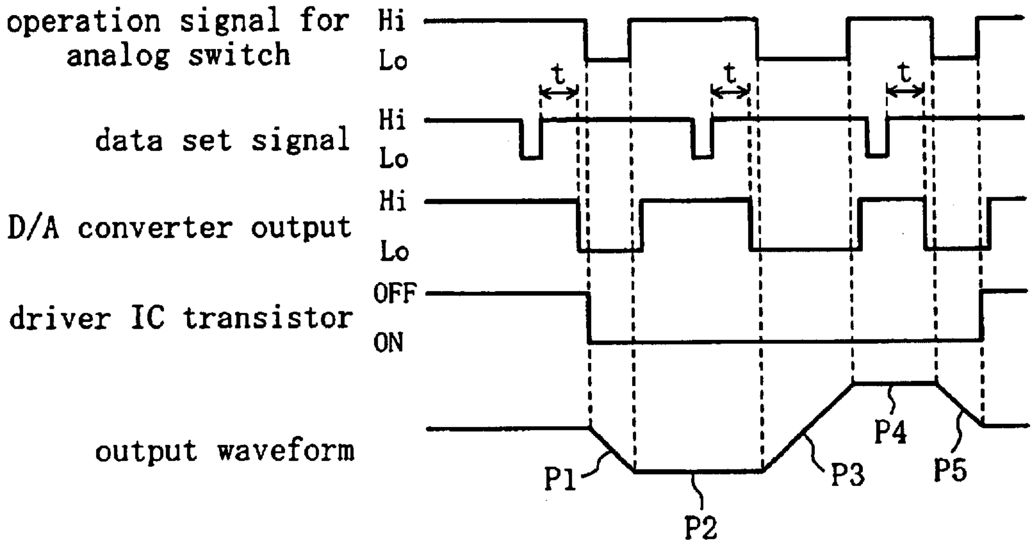
FIG. 7 is a time-chart for generating the voltage waveform in FIG. 4 with the inkjet head driving circuit according to the second example.
Figure 8:
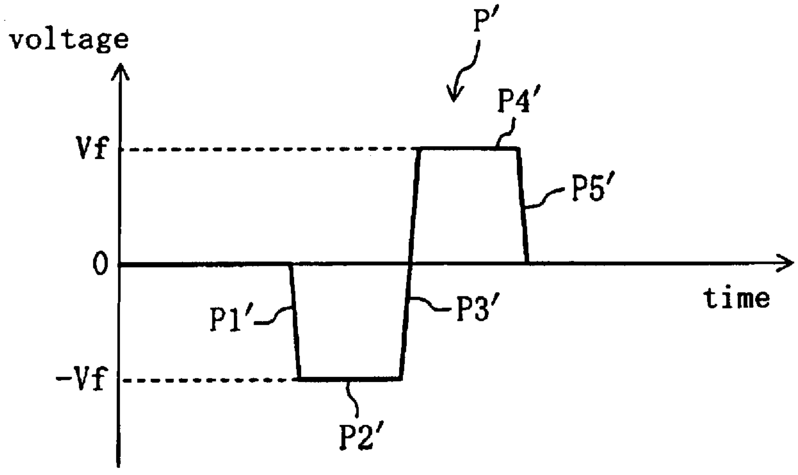
FIG. 8 PRIOR ART
FIG. 8 is a waveform diagram showing an example of a voltage waveform generated with a conventional inkjet head driving circuit.
Figure 9:
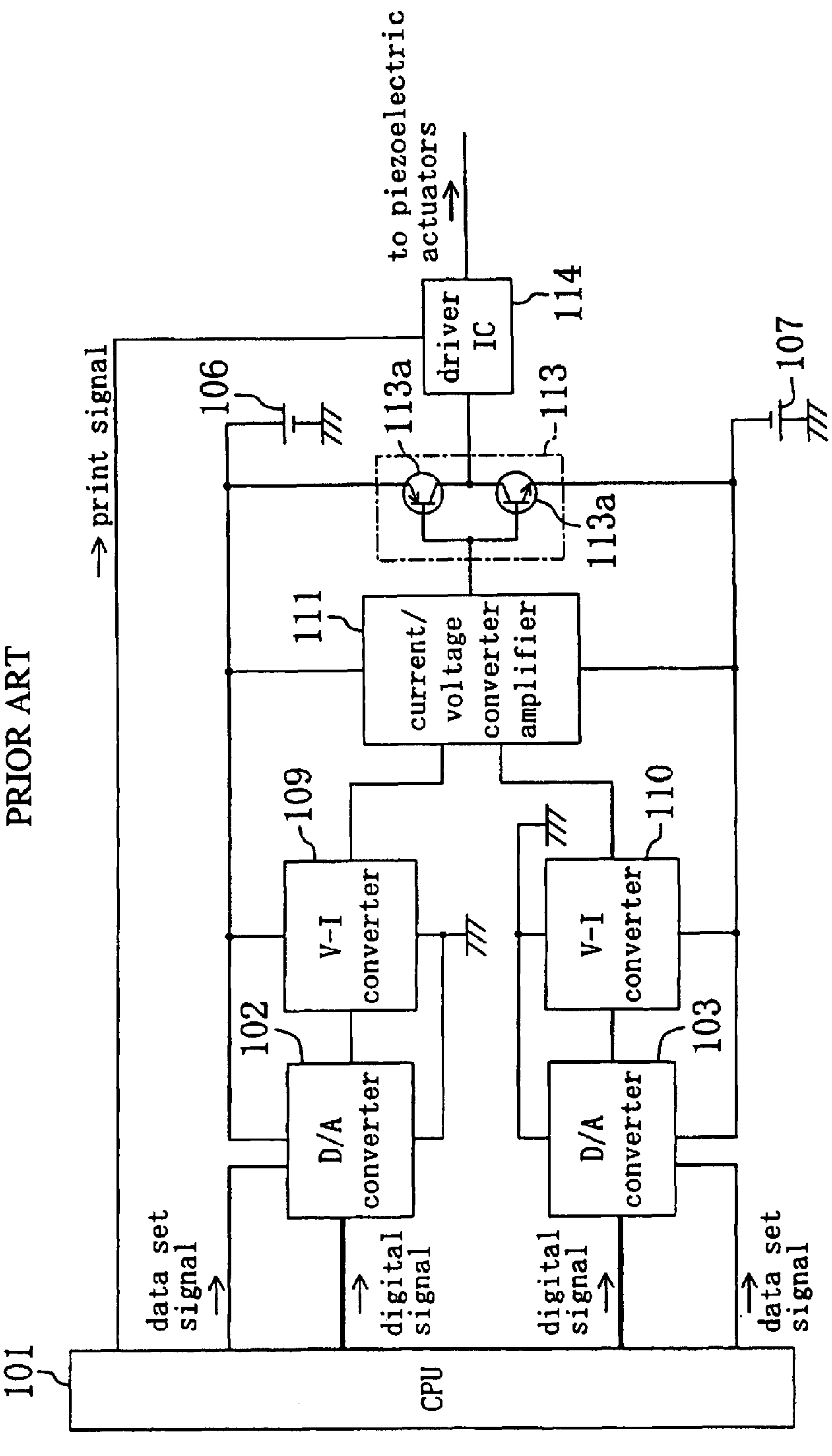
FIG. 9 PRIOR ART
FIG. 9 is a schematic circuit diagram showing a conventional inkjet head driving circuit.

Next, the operation of the inkjet head driving circuit according to this second example for generating the first to fifth waveforms P1 to P5 is explained with FIG. 7.

At the stage before waveform generation, the analog switch 71 receives an operation signal (Hi state in FIG. 7) from the CPU 61, which puts it into a state connecting the constant voltage source 72 and the waveform generating portion 64, and thus the output voltage of the constant voltage source 72 is input into the waveform generating portion 64. The output voltage of the constant voltage source 72 is equal to the predetermined potential V2, so that as in the first example, the waveform generating portion 64 outputs the intermediate potential Vb.

Next, a data set signal and a digital signal that sets the output voltage of the D/A converter 62 to the minimum value are output from the CPU 61 to the D/A converter 62, and after a predetermined time has elapsed after the input of the data set signal, the output of the D/A converter 62 is settled, and the analog voltage is output. This output state is maintained by the above-mentioned latch signal.

Then, after the output of the D/A converter 62 has settled, and the analog voltage has been output (after a time that is slightly longer than the maximum value of the data settling time has elapsed after the input of the data set signal), the input into the analog switch 71 is switched, with an operation signal from the CPU 61 (Lo state in FIG. 7), from the output voltage of the constant voltage source 72 to the output voltage of the D/A converter 62. Thus, the D/A converter 62 and the waveform generating portion 64 become connected, and the analog voltage is input into the waveform generating portion 64, and as a result, the waveform generating portion 64 generates/outputs the first waveform P1, as in the first example described above. It should be noted that, in this second example, substantially at the same time as the switching of the input into the analog switch 71, the driver IC 69 sets the switching transistors corresponding to the selected piezoelectric actuators 21 to the ON state, and this state is continued substantially until the end of the generation of the fifth waveform P5.

After that, at substantially the same time as the end of the generation of the first waveform P1, the input into the analog switch 71 is switched from the output voltage of the D/A converter 62 to the output voltage of the constant voltage source 72, and thus the waveform generating portion 64 generates/outputs the second waveform P2. It should be noted that substantially at the same time as the end of the generation of the first waveform P1 or after that, the maintaining of the output state of the D/A converter 62 due to the latch signal is terminated.

Subsequently, a data set signal and a digital signal that sets the output voltage of the D/A converter 62 to the maximum value are output from the CPU 61 to the D/A converter 62, and when the output of the D/A converter 62 has settled, the analog voltage is output. Then, after the output of the D/A converter 62 has settled, and the analog voltage has been output (after a time that is slightly longer than the maximum value of the data settling time has elapsed after the input of the data set signal), the input into the analog switch 71 is switched from the output voltage of the constant voltage source 72 to the output voltage of the D/A converter 62. Thus, the D/A converter 62 and the waveform generating portion 64 become connected, the analog voltage is input into the waveform generating portion 64, and the waveform generating portion 64 generates/outputs the third waveform P3.

After that, at substantially the same time as the end of the generation of the third waveform P3, the input into the analog switch 71 is switched from the output voltage of the D/A converter 62 to the constant voltage source 72, and thus the waveform generating portion 64 generates/outputs the fourth waveform P4.

Subsequently, a data set signal and a digital signal that sets the output voltage of the D/A converter 62 to the minimum value are output from the CPU 61 to the D/A converter 62, and when the output of the D/A converter 62 has settled, the analog voltage is output. Then, after the output of the D/A converter 62 has settled, and the analog voltage has been output (after a time that is slightly longer than the maximum value of the data settling time has elapsed after the input of the data set signal), the input into the analog switch 71 is switched from the output voltage of the constant voltage source 72 to the output voltage of the D/A converter 62. Thus, the waveform generating portion 64 generates/outputs the fifth waveform P5.

Subsequently, at substantially the same time as the end of the generation of the fifth waveform P5, the input into the analog switch 71 is switched from the output voltage of the D/A converter 62 to the output voltage of the constant voltage source 72, and thus the waveform generating portion 64 outputs the intermediate potential Vb until the next driving pulse P is generated.

It should be noted that during the time in which the output voltage of the constant voltage source 72 is being input into the analog switch 71, the output voltage of the D/A converter 62 can be the predetermined potential V2 as in the first example, or another potential, such as ground potential.

Consequently, with the inkjet driving circuit according to the second example, when neither a voltage rising waveform or a voltage falling waveform is being generated (when no digital signal for generating a voltage rising waveform or a voltage falling waveform with the waveform generating portion 64 is being input into the D/A converter 62), the output voltage of the constant voltage source 72 serves as the input into the analog switch 71, so that the predetermined potential V2 from the constant voltage source 72 is output to the waveform generating portion 64, regardless of the output voltage of the D/A converter 62. That is to say, even if a digital signal setting the output voltage of the D/A converter 62 to the predetermined potential V2 is output by the CPU 61 to the D/A converter 62, there is the possibility that the output of the D/A converter 62 deviates slightly from the predetermined potential V2 due to variations in the characteristics of the D/A converter 62, but in this second example, the predetermined potential V2 is output from the constant voltage source 72, which can output a precise voltage, to the waveform generating portion 64, and thus, malfunctioning of the waveform generating portion 64 due to variations in the characteristics of the D/A converter 62 can be prevented. As a consequence, the ink ejection performance of the inkjet recording device can be improved.

Furthermore, when a voltage rising waveform or a voltage falling waveform is generated by the waveform generating portion 64 (when a digital signal for generating a voltage rising waveform or a voltage falling waveform with the waveform generating portion 64 is input into the D/A converter 62), then the input into the analog switch 71 is switched from the output voltage of the constant voltage source 72 to the output voltage of the D/A converter 62, and in this situation, after the output of the D/A converter 62 has settled, the input into the analog switch 71 is switched, so that the waveform generation timing can be controlled with the analog switch 71. That is to say, the time (predetermined time t) from the input of the data set signal until the output of the D/A converter 62 has settled fluctuates depending on the output voltage of the D/A converter 62 and variations in its characteristics, so that if there is no analog switch 71, or even if there is the analog switch 71, but the input into the analog switch 71 is switched to the output voltage of the D/A converter 62 before the output of the D/A converter 62 has settled, then the result is variations in the generation/output timing of the voltage rising waveform or the voltage falling waveform by the waveform generating portion 64. However, in this second example, the input into the analog switch 71 is switched to the output voltage of the D/A converter 62 only after the output of the D/A converter 62 has settled, so that the voltage rising waveform or voltage falling waveform can be generated/output substantially at the same time as the switching of the input into the analog switch 71. As a result, variations in the waveform generating timing brought about by fluctuations in the output settling time of the D/A converter 62 are prevented, and voltage waveforms can be generated/output at an ordinarily constant timing. Thus, variations in the ink ejection amount can be suppressed to a rather small amount, and the positional precision with which ink drops are shot onto the recording paper 51 can be improved, attaining a high image quality.

It should be noted that in the second example, the input into the analog switch 71 is switched from the output voltage of the constant voltage source 72 to the output voltage of the D/A converter 62 after the output of the D/A converter 62 has settled, but it is also possible to switch the input into the analog switch 71 to the output voltage of the D/A converter 62 before the output of the D/A converter 62 has settled (for example, at the same time as the digital signal for generating the voltage rising waveform or the voltage falling waveform with the waveform generating portion 64 is input into the D/A converter 62). Also in this case, malfunctioning of the waveform generating portion 64 due to variations in the characteristics of the D/A converter 62 can be prevented. However, for example with regard to improving the positional precision with which the ink drops are shot, it is preferable that the second example is adopted.

Furthermore, in the above embodiments, the driving pulse P is of the pull-push-pull type, but the present invention can also be applied to push-pull types or pull-push types having only one voltage rising waveform and one voltage falling waveform.

Moreover, in the above embodiments, the waveform generating portion 64 is configured such that it generates a voltage rising waveform when the output voltage of the D/A converter 62 is larger than a predetermined potential V2, and a voltage falling waveform when the output voltage of the D/A converter 62 is smaller than the predetermined potential V2, but it can also be configured such that it generates the voltage falling waveform when the output voltage of the D/A converter 62 is larger than a predetermined potential V2, and a voltage rising waveform when the output voltage of the D/A converter 62 is smaller than the predetermined potential V2.

Furthermore, in the above embodiments, the waveform generating circuit was applied to an inkjet head driving circuit driving the piezoelectric actuators 21 of an inkjet head H in an inkjet recording device, but the waveform generating circuit of the present invention can be applied to any device that drives by applying a voltage pulse having a voltage rising waveform and a voltage falling waveform.

INDUSTRIAL APPLICABILITY

The present invention is useful for devices on which actuators are mounted that are driven by application of voltage pulses, in particular for inkjet recording devices provided with actuators for ink ejection, and its industrial applicability is high in that it can achieve a circuit that is less expensive and takes up less space, and stable voltage waveforms can be generated.

What is claimed is:

1. A waveform generating circuit, comprising:

one D/A converter that converts a digital signal into an analog voltage and outputs the analog voltage; and a waveform generating portion into which an output voltage of the D/A converter is input, which generates one of a voltage rising waveform and a voltage falling waveform when the output voltage of the D/A converter is larger than a predetermined potential that is midway between a maximum value and a minimum value of that output voltage, and generates the other waveform when the output voltage of the D/A converter is smaller than the predetermined potential.

2. The waveform generating circuit according to claim 1, further comprising:

a constant voltage source outputting a constant voltage equal to the predetermined potential; and a switching means, whose input can be switched between the output voltage of the D/A converter and the output voltage of the constant voltage source, and which outputs one of those two output voltages to the waveform generating portion;

wherein the switching means is configured such that when a digital signal for generating a voltage rising waveform or a voltage falling waveform with the waveform generating portion is input into the D/A converter, the input into the switching means is switched from the output voltage of the constant voltage source to the output voltage of the D/A converter.

3. The waveform generating circuit according to claim 2, wherein the switching means is configured such that the input into the switching means is switched from the output voltage of the constant voltage source to the output voltage of the D/A converter after the output of the D/A converter has settled.

4. An inkjet head driving circuit driving an actuator for ink ejection provided on an inkjet head, comprising:

one D/A converter that converts a digital signal into an analog voltage and outputs the analog voltage; and a waveform generating portion into which an output voltage of the D/A converter is input, which generates one of a voltage rising waveform and a voltage falling waveform and outputs it to the actuator when the output voltage of the D/A converter is larger than a predetermined potential that is midway between a maximum value and a minimum value of that output voltage, and which generates the other waveform and outputs it to the actuator when the output voltage of the D/A converter is smaller than the predetermined potential.

5. The inkjet head circuit according to claim 4, further comprising:

a constant voltage source outputting a constant voltage equal to the predetermined potential; and a switching means, whose input can be switched between the output voltage of the D/A converter and the output voltage of the constant voltage source, and which outputs one of those two output voltages to the waveform generating portion;

wherein the switching means is configured such that when a digital signal for generating a voltage rising waveform or a voltage falling waveform with the waveform generating portion is input into the D/A converter, the input into the switching means is switched from the output voltage of the constant voltage source to the output voltage of the D/A converter.

6. The waveform generating circuit according to claim 5, wherein the switching means is configured such that the input into the switching means is switched from the output voltage of the constant voltage source to the output voltage of the D/A converter after the output of the D/A converter has settled.

7. An inkjet recording device, comprising:

an inkjet head having a pressure chamber filled with ink, a nozzle linked to the pressure chamber, and an actuator that is caused to eject the ink inside the pressure chamber through the nozzle by application of a voltage;

a relative movement means that moves the inkjet head and a recording medium relatively to one another; and an inkjet head driving circuit driving the actuator of the inkjet head;

wherein the inkjet head driving circuit comprises one D/A converter that converts a digital signal into an analog voltage and outputs the analog voltage, and a waveform generating portion into which an output voltage of the D/A converter is input, which generates one of a voltage rising waveform and a voltage falling waveform and outputs it to the actuator when the output voltage of the D/A converter is larger than a predetermined potential that is midway between a maximum value and a minimum value of that output voltage, and which generates the other waveform and outputs it to the actuator when the output voltage of the D/A converter is smaller than the predetermined potential; and wherein recording is performed by ejecting ink from the nozzle of the inkjet head onto the recording medium by outputting to the actuator the voltage waveform generated by the waveform generating portion of the inkjet head driving circuit when the inkjet head is moved in relation to the recording medium by the relative movement means.

* * * * *